US009716304B2

(12) United States Patent
White

(10) Patent No.: US 9,716,304 B2
(45) Date of Patent: Jul. 25, 2017

(54) MULTI-OCTAVE 180 DEGREE PHASE BIT

(71) Applicant: RAYTHEON COMPANY, Waltham, MA (US)

(72) Inventor: Mikel J. White, Murphy, TX (US)

(73) Assignee: RAYTHEON COMPANY, Waltham, MA (US)

( * ) Notice: Subject to any disclaimer, the term of this patent is extended or adjusted under 35 U.S.C. 154(b) by 129 days.

(21) Appl. No.: 14/858,836

(22) Filed: Sep. 18, 2015

(65) Prior Publication Data

US 2017/0084978 A1 Mar. 23, 2017

(51) Int. Cl.

| | |
|---|---|
| ***H01P 5/10*** | (2006.01) |
| ***H01P 1/18*** | (2006.01) |
| ***H01P 5/19*** | (2006.01) |
| ***H01P 3/02*** | (2006.01) |
| ***H01P 1/12*** | (2006.01) |
| *H03H 7/42* | (2006.01) |

(52) U.S. Cl.

CPC ................ *H01P 5/10* (2013.01); *H01P 1/127* (2013.01); *H01P 1/182* (2013.01); *H01P 3/026* (2013.01); *H01P 5/19* (2013.01)

(58) Field of Classification Search

CPC ................ H01P 5/10; H01P 1/18; H03H 7/42

USPC ............................................. 333/26, 33, 101

See application file for complete search history.

(56) References Cited

U.S. PATENT DOCUMENTS

| | | | | |
|---|---|---|---|---|
| 4,085,391 | A * | 4/1978 | Schiek | H01P 5/1007 333/26 |
| 4,146,896 | A | 3/1979 | Baril et al. | |
| 4,800,393 | A * | 1/1989 | Edward | H01Q 9/065 333/26 |
| 6,452,462 | B2 * | 9/2002 | Lo | H01P 5/1007 333/26 |
| 6,674,340 | B2 * | 1/2004 | Quan | H01P 1/127 333/164 |
| 8,362,849 | B2 | 1/2013 | White | |
| 2003/0193377 | A1 | 10/2003 | Quan et al. | |
| 2011/0279191 | A1 | 11/2011 | Choi et al. | |
| 2015/0123864 | A1 * | 5/2015 | Boryssenko | H01Q 9/16 343/813 |

FOREIGN PATENT DOCUMENTS

| | | |
|---|---|---|
| EP | 2 230 713 B1 | 1/2012 |

OTHER PUBLICATIONS

Llamas , M.A.; et al., "RF-MEMS Uniplanar 180° Phase Switch Based on a Multimodal Air-Bridged CPW Cross," *IEEE Transactions on Microwave Theory and Techniques*, , vol. 59, No. 7, Jul. 2011, pp. 1769-1777.

(Continued)

*Primary Examiner* — Dean Takaoka

(74) *Attorney, Agent, or Firm* — Lewis Roca Rothgerber Christie LLP

(57) ABSTRACT

A balun includes: a balanced port; an unbalanced port; and a double-y junction portion between the balanced port and the unbalanced port, the double-y junction portion including: a balanced y junction portion having first and second balanced stubs; and an unbalanced y junction portion having first and second unbalanced stubs, wherein at least one of the first balanced stub, the second balanced stub, the first unbalanced stub, and the second unbalanced stub includes a switch.

20 Claims, 7 Drawing Sheets

(56) References Cited

OTHER PUBLICATIONS

Llamas, M.A.; et al., "MEMS-Based 180° Phase Switch for Differential Radiometers," *IEEE Transactions on Microwave Theory and Techniques*, vol. 58, No. 5, May 2010, pp. 1264-1272.
Villa, E, et al., "Wideband uniplanar 180° phase switch," *Electronics Letters*, vol. 45., No. 11, May 21, 2009; 2 pages.
Unknown, "Broadband Microstrip-to-Coplanar Strip Double-Y Balun," Electronics/Computers, *NASA Tech Briefs*, Aug. 2008, pp. 11, 12.
Venkatesan, J., Scott, Jr., W., "Investigation of the Double-Y Balun for Feeding Pulsed Antennas," *Proceedings of the SPIE*, vol. 5089, Apr. 2003, 11 pages.

* cited by examiner

MULTI-OCTAVE 180 DEGREE PHASE BIT

BACKGROUND

Phase shifters are devices that shift the phase of a signal propagating through a transmission line. Phase shifters may be used in various applications, such as scanning applications, system detection algorithms, beaming forming applications, phased array antenna systems, etc. Phase bits greater than 45 degrees are typically limited to 4:1 bandwidths, and multi-octave 180 degree phase shifters are typically limited to 3:1 bandwidths. Thus, for applications exceeding 3:1 bandwidths, time-delay circuits have generally been used.

The above information disclosed in this Background section is only for enhancement of understanding of the background of the invention, and therefore, it may contain information that does not form prior art

SUMMARY

One or more aspects of example embodiments of the present invention provide a balun and a phase shifter including the balun.

A balun is an electrical device that splits a single signal (e.g., an unbalanced signal) into two out of phase signals (e.g., a balanced signal), or combines the two out of phase signals into the single signal. One kind of balun that provides superior bandwidth performance compared to other kinds of baluns is a double-y balun. The double-y balun splits a single signal into two signals that are each 180 degrees out of phase, and/or combines two out of phase signals into a single signal.

The double-y balun includes a double-y junction having a plurality of balanced stubs and a plurality of unbalanced stubs, each of the stubs being either an open stub or a closed stub. The double-y balun utilizes symmetry of the double-y junction to split or combine the signal, as the case may be. By switching the open and closed stubs, and thus, changing the symmetry of the double-y junction, the path of the signal through the open and closed stubs may change, and the phase of the signal may be changed (e.g., inverted or shifted by about 180 degrees).

According to an embodiment of the present invention a balun includes: a balanced port; an unbalanced port; and a double-y junction portion between the balanced port and the unbalanced port, the double-y junction portion including: a balanced y junction portion having first and second balanced stubs; and an unbalanced y junction portion having first and second unbalanced stubs, wherein at least one of the first balanced stub, the second balanced stub, the first unbalanced stub, and the second unbalanced stub comprises a switch.

The first balanced stub may include a first switch, the second balanced stub may include a second switch, the first unbalanced stub may include a third switch, and the second unbalanced stub may include a fourth switch.

The first and fourth switches may be configured to be closed and the second and third switches may be configured to be open during a reference mode, and the first and fourth switches may be configured to be open and the second and third switches may be configured to be closed during a phase shift mode.

Each of the first, second, third, and fourth switches may include a field effect transistor (FET).

Each of the first, second, third, and fourth switches may include a microelectromechanical system (MEMS) switch.

The unbalanced y junction portion including the unbalanced port may include a coplanar waveguide (CPW), and the balanced y junction portion including the balanced port may include a slot line.

The unbalanced y junction portion including the unbalanced port may include a microstrip, and the balanced y junction portion including the balanced port may include a slot line.

According to another embodiment of the present invention, a phase shifter includes: a balanced port; a first unbalanced port; and a first double-y junction portion between the balanced port and the first unbalanced port, the first double-y junction portion including: a first y portion having first and second stubs; and a second y portion having third and fourth stubs, wherein at least one of the first, second, third, and fourth stubs comprise a switch.

The switch may include a field effect transistor (FET).

The switch may include a microelectromechanical system (MEMS) switch.

The phase shifter may further include: a second unbalanced port coupled to the balanced port; and a second double-y transition portion between the balanced port and the second unbalanced port, the second double-y transition portion may include: a third y portion having fifth and sixth stubs; and a fourth y portion having seventh and eighth stubs.

The first stub may include a first switch, the second stub may include a second switch, the third stub may include a third switch, and the fourth stub may include a fourth switch.

The fifth stub may be configured to be a closed stub, the sixth stub may be configured to be an open stub, the seventh stub may be configured to be an open stub, and the eighth stub may be configured to be a closed stub.

The first and fourth switches may be configured to be closed and the second and third switches may be configured to be open during a reference mode, and the first and fourth switches may be configured to be open and the second and third switches may be configured to be closed during a phase shift mode.

Each of the first, second, seventh, and eighth stubs may include a switch, and each of the third, fourth, fifth, and sixth stubs may not include a switch.

Each of the first, second, seventh, and eighth stubs may not include a switch, and each of the third, fourth, fifth, and sixth stubs may include a switch.

At least one of the first y portion and the fourth y portion may include a coplanar waveguide (CPW).

The second y portion and the third y portion may include a slot line.

At least one of the first y portion and the fourth y portion may include a microstrip.

The second y portion and the third y portion may include a slot line.

BRIEF DESCRIPTION OF THE DRAWINGS

The above and other aspects and features of the present invention will become apparent to those skilled in the art from the following detailed description of the example embodiments with reference to the accompanying drawings. In the drawings, the relative sizes of elements, layers, and regions may be exaggerated for clarity.

DETAILED DESCRIPTION

Hereinafter, example embodiments of the present invention will be described in more detail with reference to the accompanying drawings. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described.

Figure 1:
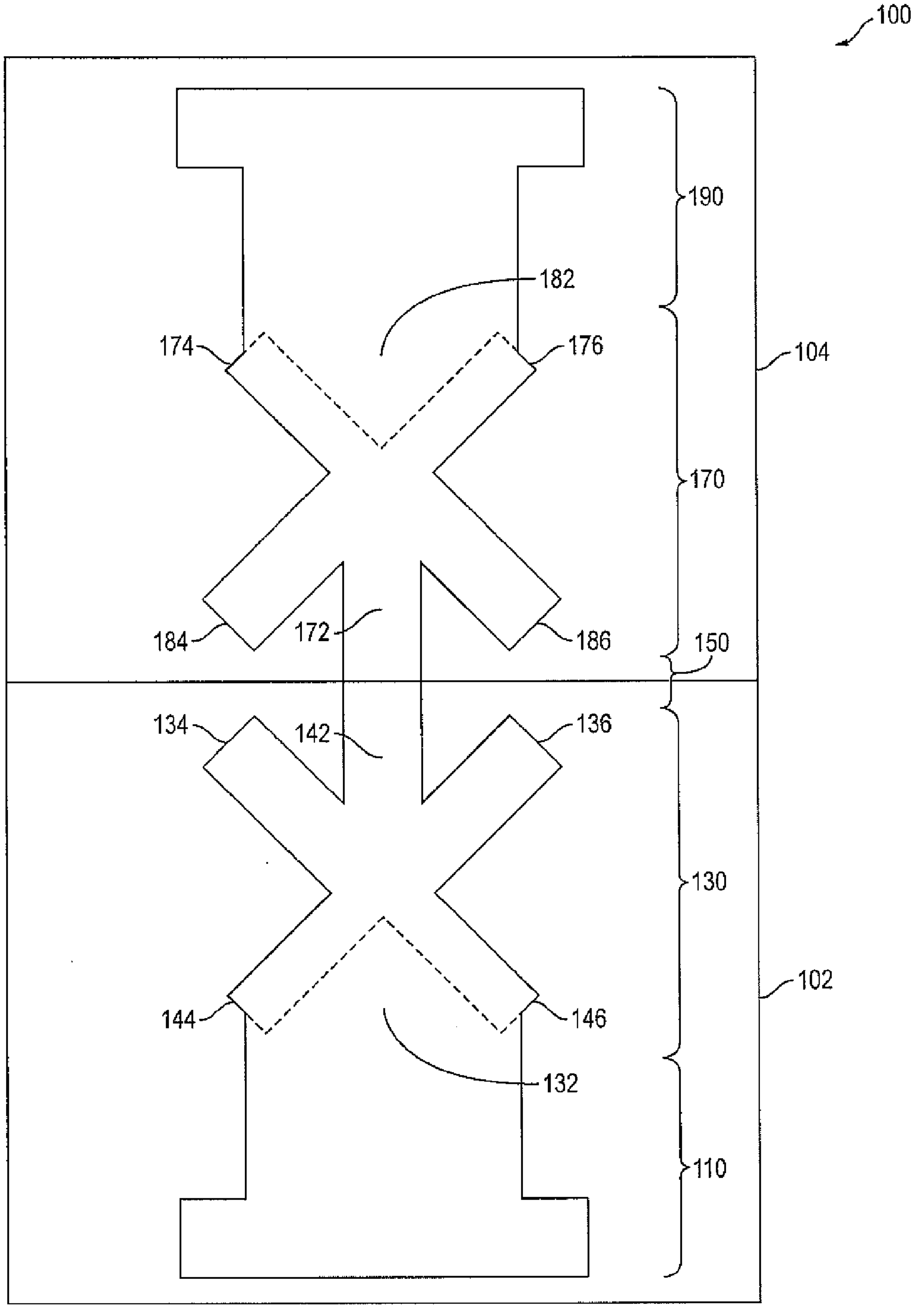
FIG. 1 illustrates a phase shifter, according to some embodiments of the present invention.

FIG. 1 illustrates a phase shifter according to some embodiments of the present invention. Referring to FIG. 1, the phase shifter 100 includes a first balun 102 coupled to a second balun 104 through a balanced line 150 therebetween. The first balun 102 may include a first unbalanced line 110, a portion of the balanced line 150, and a first double-y junction portion 130 coupled between the first unbalanced line 110 and the balanced line 150. The second balun 104 may include another portion of the balanced line 150, a second unbalanced line 190, and a second double-y junction portion 170 coupled between the balanced line 150 and the second unbalanced line 190.

In some embodiments, the first double-y junction portion 130 may include a first y junction portion and a second y junction portion. The first y junction portion may include a first unbalanced port 132 coupled to the first unbalanced line 110, a first stub 134, and a second stub 136. The second y junction portion may include a first balanced port 142 coupled to the balanced line 150, a third stub 144, and a fourth stub 146.

In some embodiments, the second double-y junction portion 170 may include a third y junction portion and a fourth y junction portion. The third y junction portion may include a second balanced port 172 coupled to the balanced line 150, a fifth stub 174, and a sixth stub 176. The fourth y junction portion may include a second unbalanced port 182 coupled to the second unbalanced line 190, a seventh stub 184, and an eighth stub 186.

Transmission between the first unbalanced port 132 and the first balanced port 142 may be controlled by the open or closed states of each of the first, second, third, and fourth stubs 134, 136, 144, and 146. For example, in order to have complete transmission between the first unbalanced port 132 and the first balanced port 142, the first, second, third, and fourth stubs 134, 136, 144, and 146 may be alternately opened and closed (e.g., the first and fourth stubs may be opened and the second and third stubs may be closed). Likewise, transmission between the second unbalanced port 182 and the second balanced port 172 may be controlled by the open or closed states of each of the fifth, sixth, seventh, and eighth stubs 174, 176, 184, and 186. For example, in order to have complete transmission between the second unbalanced port 182 and the second balanced port 172, the fifth, sixth, seventh, and eighth stubs 174, 176, 184, and 186 may be alternately opened and closed (e.g., the sixth and seventh stubs may be opened and the fifth and eighth stubs may be closed).

As will be described in more detail later, in some embodiments, at least one of the first, second, third, fourth, fifth, sixth, seventh, and eighth stubs 134, 136, 144, 146, 174, 176, 184, and 186 may include a switch configured to change the open or closed state of the stub, thereby changing a path of the signal through the stubs. Accordingly, symmetry in the corresponding double-y junction portion may be changed, and the phase of the signal may be shifted (e.g., inverted or about 180 degree phase shifted) during the transmission of the signal between the corresponding balanced and unbalanced ports.

In some embodiments, the balanced line 150 including the second y junction portion and the third y junction portion may be implemented as a coplanar slotline (or coplanar strip line "CPS"). In some embodiments, the unbalanced lines 110 and 190 including the first y junction portion and the fourth y junction portion may be implemented as a coplanar waveguide (CPW). In some embodiments, the unbalanced lines 110 and 190 including the first y junction portion and the fourth y junction portion may be implemented as a microstrip. However, the present invention is not limited thereto, for example, in some embodiments, one of the first unbalanced line 110 including the first y junction portion and the second unbalanced line 190 including the fourth y junction portion may be implemented as a CPW, while the other one of the first unbalanced line 110 including the first y junction portion and the second unbalanced line 190 including the fourth y junction portion may be implemented as a microstrip.

While FIG. 1 illustrates the first balun 102 being coupled to the second balun 104 back-to-back, that is, the first balun 102 is coupled to the second balun 104 at the balanced line 150 so that the first balanced port 142 and the second balanced port 172 face each other, the present invention is not limited thereto. For example, in some embodiments, the first balun 102 may be coupled to the second balun 104 at their unbalanced lines 110 and 190, so that the first unbalanced port 132 and the second unbalanced port 182 face each other. In this configuration, there may be additional insertion loss and the size of the overall circuit may increase.

As will be described in more detail below, in some embodiments, at least one of the first through eighth stubs 134 to 186 may include a switch configured to open or close (e.g., short) an end portion of the stub. Accordingly, the phase shifter 100 may phase shift (e.g., invert or about 180 degree phase shift) a signal propagating through, according to the open or closed state of the stub as controlled by the switch.

Figure 2:
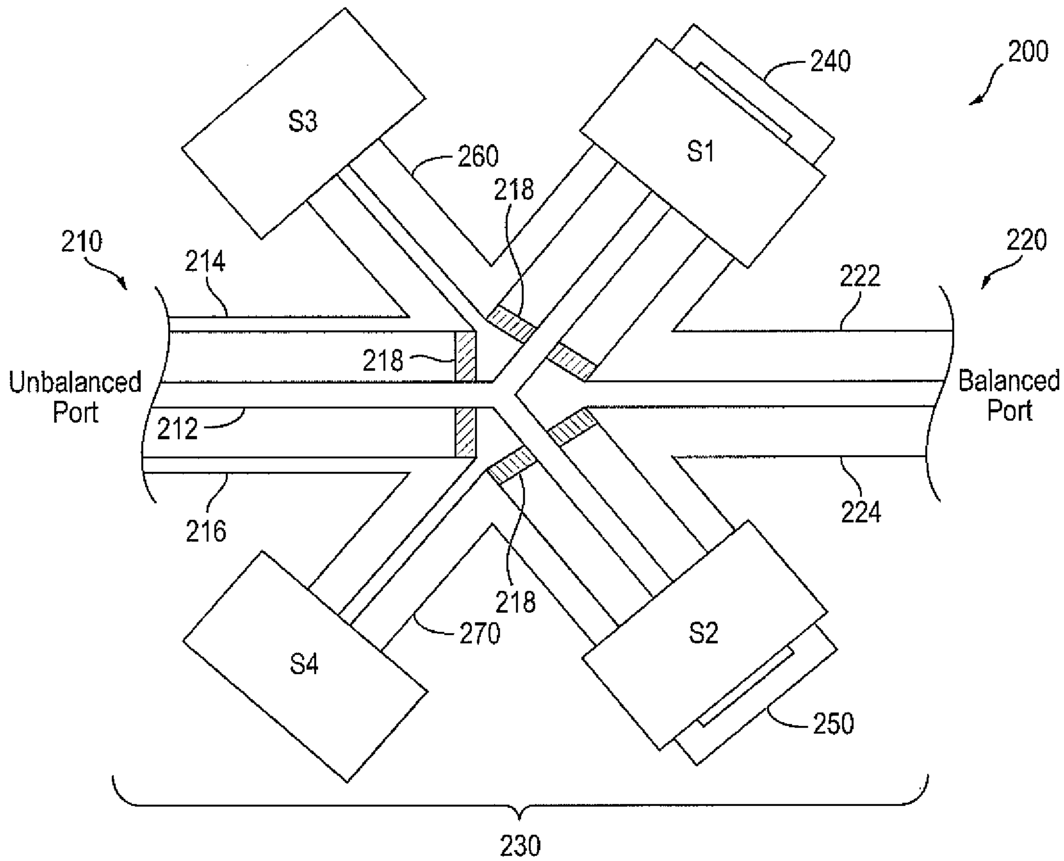
FIG. 2 illustrates a double-y junction portion of a balun shown in FIG. 1, according to some embodiments of the present invention.
Figure 3A:
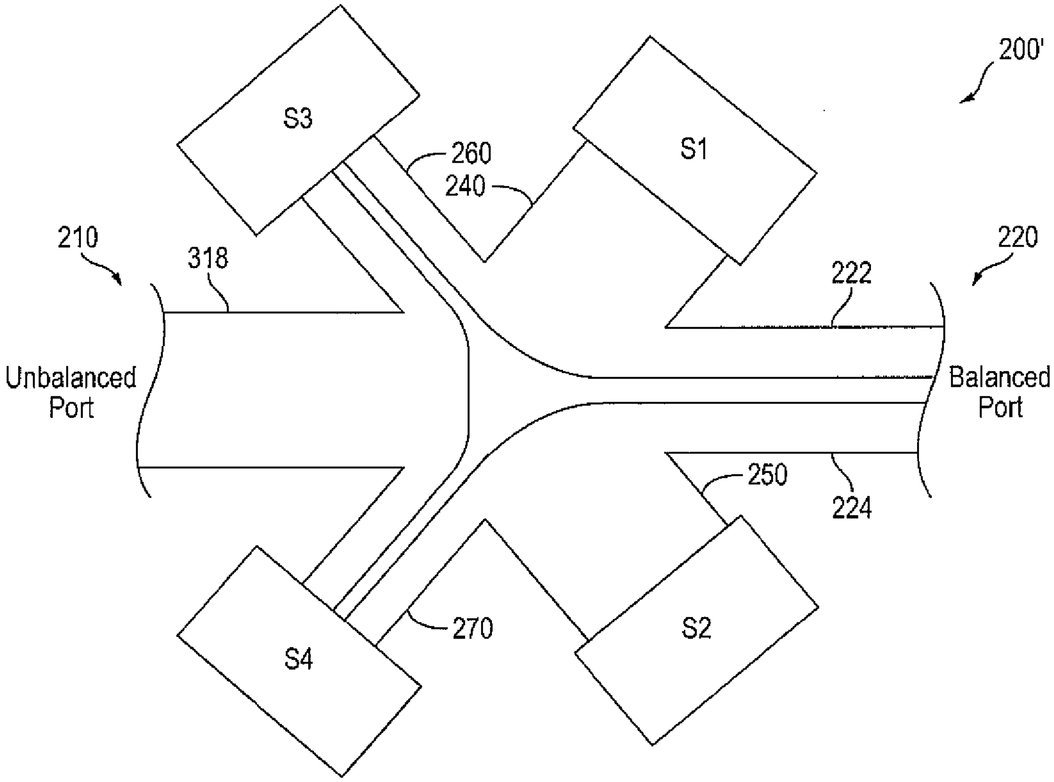
FIGS. 3A and 3B illustrate top and bottom views, respectively, of a double-y junction portion of a balun shown in FIG. 1, according to some embodiments of the present invention.
Figure 3B:
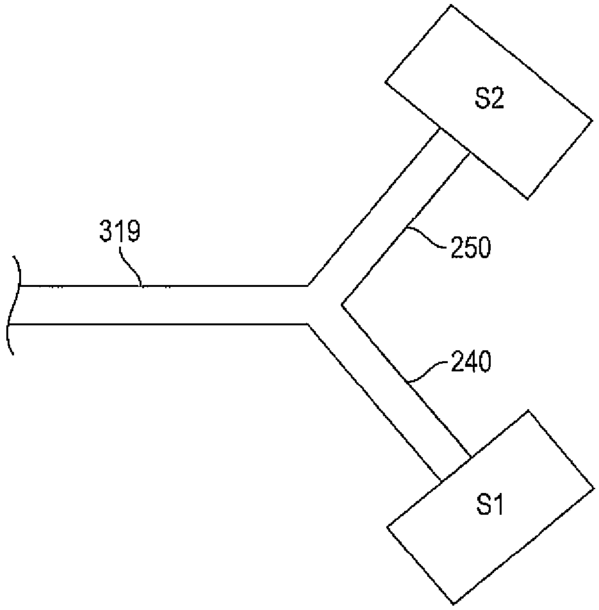

FIG. 2 illustrates a double-y junction portion of a balun shown in FIG. 1 according to some embodiments of the present invention, and FIGS. 3A and 3B illustrate top and bottom views, respectively, of a double-y junction portion of a balun shown in FIG. 1 according to some other embodiments of the present invention. That is, according to some embodiments of the present invention, at least one of the first and second double-y junction portions 130 and 170 of the phase shifter 100 in FIG. 1 may be implemented as any one of the double-y junction portions shown in FIGS. 2 and 3A-3B.

Referring to FIGS. 1, 2, 3A, and 3B, the balun 200 and 200' includes an unbalanced port 210, a balanced port 220, and a double-y junction portion 230 between the unbalanced port 210 and the balanced port 220.

The double-y junction portion 230 may include an unbalanced y junction portion and a balanced y junction portion. The unbalanced y junction portion may include the unbalanced port 210, a first unbalanced stub 240, and a second unbalanced stub 250. The balanced y junction portion may include the balanced port 220, a first balanced stub 260, and a second balanced stub 270.

In some embodiments, as shown in FIG. 2, the unbalanced y junction portion including the unbalanced port 210, the first unbalanced stub 240, and the second unbalanced stub 250 may be implemented as a coplanar waveguide (CPW) having a center conductor 212, two coplanar conductors 214 and 216, and bridges or underpasses 218 coupling the two coplanar conductors 214 and 216 to each other. However, the present invention is not limited thereto. For example, in some embodiments, as shown in FIGS. 3A and 3B, the unbalanced y junction portion including the unbalanced port 210, the first unbalanced stub 240, and the second unbalanced stub 250 may be implemented as a microstrip having a first conducting strip 318 overlapping a second conducting strip 319, with a substrate (e.g., a dielectric substrate) therebetween. When implemented as a microstrip, the underpasses 218 may be omitted.

In some embodiments, the balanced junction portion including the balanced port 220, the first balanced stub 260, and the second balanced stub 270 may be implemented as a coplanar slotline (or coplanar strip line "CPS") having a first conductor 222 and a second conductor 224.

Accordingly, as shown in FIG. 2, the balun 200 may transition from an unbalanced CPW to a balanced CPS line, or as shown in FIGS. 3A and 3B, the balun 200' may transition from an unbalanced microstrip to a balanced CPS line.

According to some embodiments of the present invention, at least one of the first unbalanced stub 240, the second unbalanced stub 250, the first balanced stub 260, and the second balanced stub 270 may include a switch. For example, as shown in FIGS. 2, 3A, and 3B, the first unbalanced stub 240 may include a first switch S1, the second unbalanced stub 250 may include a second switch S2, the first balanced stub 260 may include a third switch S3, and the second balanced stub 270 may include a fourth switch 280. The switches S1, S2, S3, and S4 may be configured to open and/or close (e.g., short) the first unbalanced stub 240, the second unbalanced stub 250, the first balanced stub 260, and the second balanced stub 270, respectively, when a control signal is received from the outside. For example, the control signal may be generated from a field programmable gate array (FPGA) or an ASIC configured to convert a signal received from a computer (e.g., a beam-steering-computer for array applications), microprocessor, other logic level shifter, etc., into the control signal.

While FIGS. 2, 3A, and 3B illustrate the first unbalanced stub 240, the second unbalanced stub 250, the first balanced stub 260, and the second balanced stub 270 including the first, second, third, and fourth switches S1, S2, S3, and S4, respectively, the present invention is not limited thereto. For example, in some embodiments, at least one of the unbalanced and balanced y junction portions may include at least one stub having a switch. In some embodiments, the unbalanced stubs may include switches, while the balanced stubs do not include switches. For example, the unbalanced y junction portions of the first and second baluns 102 and 104 in FIG. 1 (e.g., the first and fourth y junction portions in FIG. 1) may include the switches, while the balanced y junction portions of the first and second baluns 102 and 104 in FIG. 1 (e.g., the second and third y junction portions in FIG. 1) do not include the switches. In some embodiments, the balanced stubs may include switches, while the unbalanced stubs do not include switches. For example, the balanced y junction portions of the first and second baluns 102 and 104 in FIG. 1 (e.g., the second and third y junction portions in FIG. 1) may include the switches, while the unbalanced y junction portions of the first and second baluns 102 and 104 in FIG. 1 (e.g., the first and fourth y junction portions in FIG. 1) do not include the switches.

Figure 4A:
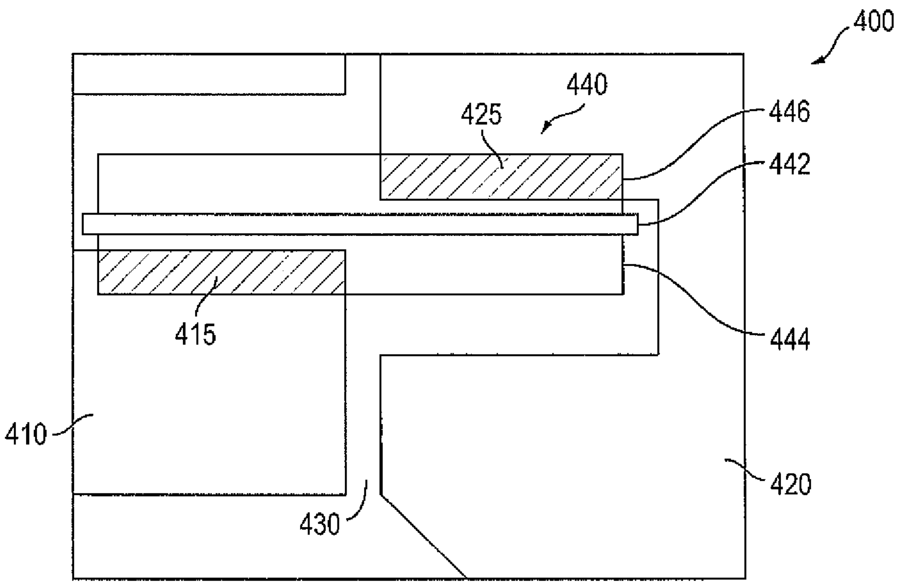
FIG. 4A is a conceptual view of a balanced stub including a switch according to some embodiments of the present invention.
Figure 4B:
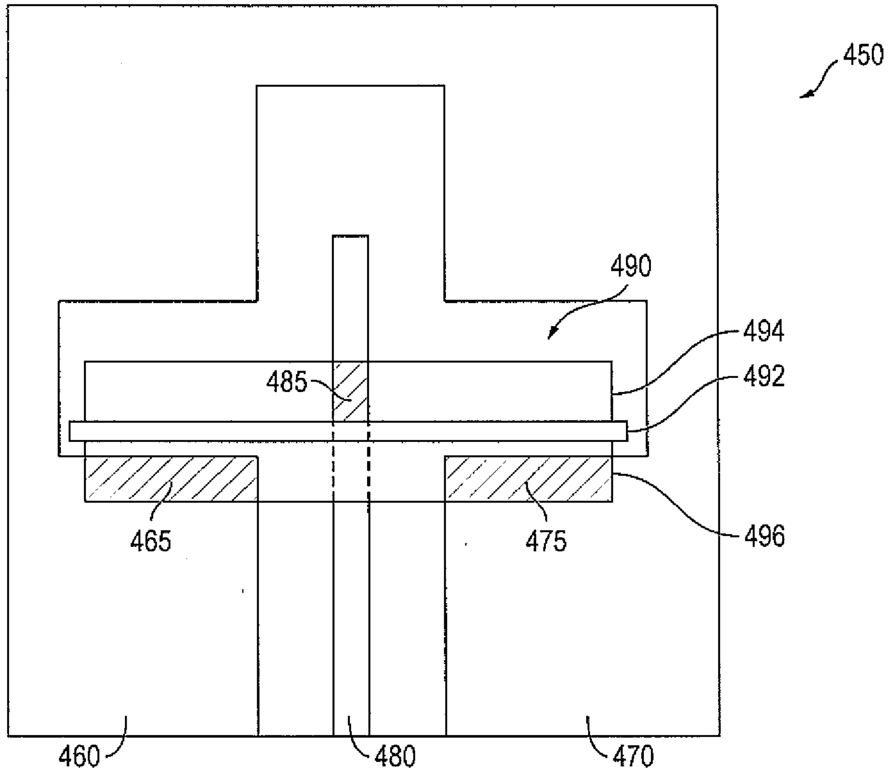
FIG. 4B is a conceptual view of an unbalanced stub including a switch according to some embodiments of the present invention.
Figure 4C:
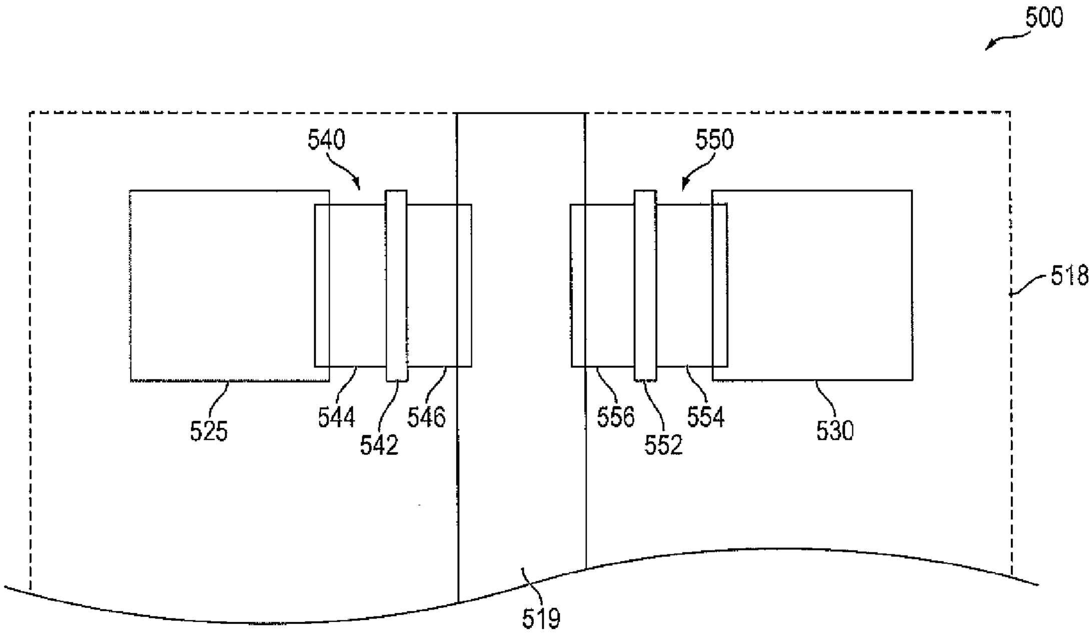
FIG. 4C is a conceptual cross-sectional view of an unbalanced stub including a switch according to some embodiments of the present invention.

FIG. 4A is a conceptual view of a balanced stub including a switch (e.g., a solid-state switch) according to some embodiments of the present invention, FIG. 4B is a conceptual view of an unbalanced stub including a switch according to some embodiments of the present invention, and FIG. 4C is a conceptual cross-sectional view of an unbalanced stub including a switch according to some embodiments of the present invention.

According to some embodiments, the switches S1, S2, S3, and S4 may be implemented as solid-state switches, for example, field effect transistors (FETs), and/or microelectromechanical system (MEMS) switches, such as an ohmic MEMS switch and/or a capacitive MEMS switch. However, the present invention is not limited thereto, and any suitable switches may be implemented on the stubs depending on the particular application. For example, any suitable phase-change switches, solid-state switches, bipolar junction transistors (BJTs), mechanical switches, and/or relays may be implemented on the stubs depending on the desired response speed and/or frequency range of the particular application.

Referring to FIG. 4A, the balanced stub 400 may be implemented as, for example, a CPS line including a first conductor 410, a second conductor 420, and a slotline 430 between the first conductor 410 and the second conductor 420. A switch (e.g., a FET switch) 440 having a gate electrode 442, a first electrode (e.g., a source or drain electrode) 444, and a second electrode (e.g., a source or drain electrode) 446 may be coupled between the first conductor 410 and the second conductor 420 at an end portion of the balanced stub 400.

The first electrode 444 and the second electrode 446 may be different electrodes from each other. For example, when the first electrode 444 is a source electrode, the second electrode 446 may be a drain electrode. When the first electrode 444 is a drain electrode, the second electrode 446 may be a source electrode.

In some embodiments, the first electrode 444 may be coupled to the first conductor 410 at a portion 415 where the first electrode 444 and the first conductor 410 are overlapped , and the second electrode 446 may be coupled to the second conductor 420 at a portion 425 where the second electrode 446 and the second conductor 420 are overlapped. When a turn on control signal is applied to the gate electrode 442, the first electrode 444 may be electrically coupled to the second electrode 446. Accordingly, the first conductor 410 may be electrically coupled to the second conductor 420 through the first and second electrodes 444 and 446 when the switch 440 is turned on, and the first conductor 410 may be electrically decoupled (e.g., electrically disconnected) from the second conductor 420 when the switch 440 is turned off Referring to FIG. 4B, the unbalanced stub 450 may be implemented as, for example, a CPW including a first coplanar conductor 460, a second coplanar conductor 470, and a center conductor 480 between the first coplanar conductor 460 and the second coplanar conductor 470. A switch (e.g., a FET switch) 490 having a gate electrode 492, a first electrode (e.g., a source or drain electrode) 494, and a second electrode (e.g., a source or drain electrode) 496 may be coupled to the center conductor 480 and the first and second coplanar conductors 460 and 470 at an end portion of the unbalanced stub 450.

The first electrode 494 and the second electrode 496 may be different electrodes from each other. For example, when the first electrode 494 is a source electrode, the second electrode 496 may be a drain electrode. When the first electrode 494 is a drain electrode, the second electrode 496 may be a source electrode.

In some embodiments, the first electrode 494 may be coupled to the center conductor 480 at a portion 485 where the first electrode 494 and the center conductor 480 are overlapped, and the second electrode 496 may be coupled to the first and second coplanar conductors 460 and 470 at portions 465 and 475, respectively, where the second electrode 496 and the first and second coplanar conductors 460 and 470 are overlapped. When a turn on control signal is applied to the gate electrode 492, the first electrode 494 may be electrically coupled to the second electrode 496. Accordingly, the center conductor 480 may be electrically coupled to the first and second coplanar conductors 460 and 470 through the first and second electrodes 494 and 496 when the switch 490 is turned on, and the center conductor 480 may be electrically decoupled (e.g., electrically disconnected) from the first and second coplanar conductors 460 and 470 when the switch 490 is turned off.

Referring to FIG. 4C, the unbalanced stub 500 may be implemented as, for example, a microstrip including a first conducting strip 518 overlapping a second conducting strip 519. FIG. 4C illustrates a cross-section view between the first conducting strip 518 and the second conducting strip 519, and thus, the first conducting strip 518 is not shown, but is represented by a dotted line for convenience of illustration.

Interconnect vias 525 and 530 extend from the first conducting strip 518 toward the second conducting strip 519. The interconnect vias 525 and 530 electrically couple the first conducting strip 518 to the second conducting strip 519 when switches 540 and 550 are turned on. While FIG. 4C shows two interconnect vias 525 and 530 and two switches 540 and 550, the present invention is not limited thereto. For example, in some embodiments, there may be one interconnect via and one switch to electrically couple the first conducting strip 518 to the second conducting strip 519. In some embodiments, there may be more than two interconnect vias and respective switches to electrically couple the first conducting strip 518 to the second conducting strip 519. According to some embodiments, by increasing the number of interconnect vias, a connection inductance between the first and second conducting strips 518 and 519 may be reduced.

The switch (e.g., a FET switch) 540 may have a gate electrode 542, a first electrode (e.g., a source or drain electrode) 544, and a second electrode (e.g., a source or drain electrode) 546. The switch 540 may be coupled between the interconnect via 525 and the second conducting strip 519 at an end portion of the unbalanced stub 500.

The first electrode 544 and the second electrode 546 may be different electrodes from each other. For example, when the first electrode 544 is a source electrode, the second electrode 546 may be a drain electrode. When the first electrode 544 is a drain electrode, the second electrode 546 may be a source electrode.

In some embodiments, the first electrode 544 may be coupled to the interconnect via 525, and the second electrode 546 may be coupled to the second conducting strip 519. When a turn on control signal is applied to the gate electrode 542, the first electrode 544 may be electrically coupled to the second electrode 546. Accordingly, the second conducting strip 519 may be electrically coupled to the first conducting strip 518 through the interconnect via 525 when the switch 540 is turned on, and the second conducting strip 519 may be electrically decoupled (e.g., electrically disconnected) from the first conducting strip 518 when the switch 540 is turned off.

The switch (e.g., a FET switch) 550 may have a gate electrode 552, a first electrode (e.g., a source or drain electrode) 554, and a second electrode (e.g., a source or drain electrode) 556. The switch 550 may be coupled between the second conducting strip 519 and the interconnect via 530 and at an end portion of the unbalanced stub 500.

The first electrode 554 and the second electrode 556 may be different electrodes from each other. For example, when the first electrode 554 is a source electrode, the second electrode 556 may be a drain electrode. When the first electrode 554 is a drain electrode, the second electrode 556 may be a source electrode.

In some embodiments, the first electrode 554 may be coupled to the interconnect via 530, and the second electrode 556 may be coupled to the second conducting strip 519. When a turn on control signal is applied to the gate electrode 552, the first electrode 554 may be electrically coupled to the second electrode 556. Accordingly, the second conducting strip 519 may be electrically coupled to the first conducting strip 518 through the interconnect via 530 when the switch 550 is turned on, and the second conducting strip 519 may be electrically decoupled (e.g., electrically disconnected) from the first conducting strip 518 when the switch 540 is turned off.

According to some embodiments, when a stub (e.g., balanced or unbalanced) does not include a switch, the stub may be hardwired to be either an open stub or a closed (e.g., a short-circuited) stub, as the case may be for the particular application. For example, in the case of a balanced stub being hardwired to be a closed stub, referring to FIG. 4A, the first conductor 410 and the second conductor 420 may be shorted together at the end portion of the balanced stub 400. In the case of an unbalanced CPW stub being hardwired to be a closed stub, referring to FIG. 4B, the center conductor 480 may be shorted with the first and second coplanar conductors 460 and 470 at the end portion of the CPW stub 450. In the case of an unbalanced microstrip stub being hardwired to be a closed stub, referring to FIG. 4C, the first conducting strip 518 may be shorted with the second conducting strip 519 (e.g., through one or more interconnect vias) at the end portion of the microstrip stub.

According to some embodiments of the present invention, the phase of a signal may be inverted depending on the open/closed state of the stubs as controlled by the switches S1, S2, S3, and S4. For example, referring again to FIG. 1, according to some embodiments of the present invention, the phase shifter 100 may include the first balun 102 having the first, second, third, and fourth switches S1, S2, S3, and S4. The first stub 134 may include the first switch S1, the second stub 136 may include the second switch S2, the third stub 144 may include the third switch S3, and the fourth stub 146 may include the fourth switch S4. In some embodiments, the stubs of the second balun 104 may be hardwired to be either an open stub or a closed stub. For example, the fifth stub 174 may be hardwired to be a closed stub, the sixth stub 176 may be hardwired to be an open stub, the seventh stub 184 may be hardwired to be an open stub, and the eighth stub 186 may be hardwired to be a closed stub. When having the above-described configuration, according to some embodiments of the present invention, the phase shifter 100 may operate in a reference mode and a phase shift mode.

During the reference mode, the first switch S1 and the fourth switch S4 may be turned off, and the second switch S2 and the third switch S3 may be turned on. Thus, the first stub 134 and the fourth stub 146 may operate as open stubs, and the second stub 136 and the third stub 144 may operate as closed stubs during the reference mode. Accordingly, the signal may be outputted with little or negligible phase shift. That is, the signal may not be phase shifted.

During the phase shift mode, the first switch S1 and the fourth switch S4 may be turned on, and the second switch S2 and the third switch S3 may be turned off. Thus, the first stub 134 and the fourth stub 146 may operate as closed stubs, and the second stub 136 and the third stub 144 may operate as open stubs during the phase shift mode. Accordingly, the signal may be phase shifted (e.g., inverted or about 180 degree phase shifted).

As will be described with reference to FIGS. 5A through 6B, when operating in the phase shift mode, the phase of the signal may be shifted by about 180 degrees with little or negligible loss over high bandwidths.

Figure 5A:
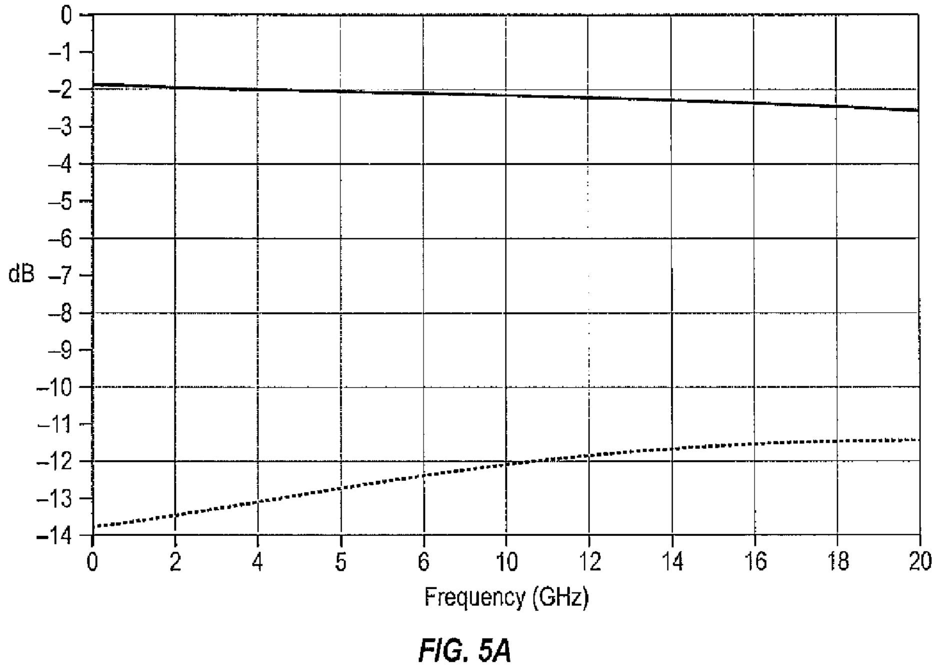
FIG. 5A is a graph illustrating insertion loss and input/output matching when the phase shifter includes FET switches according to some embodiments of the present invention.
Figure 5B:
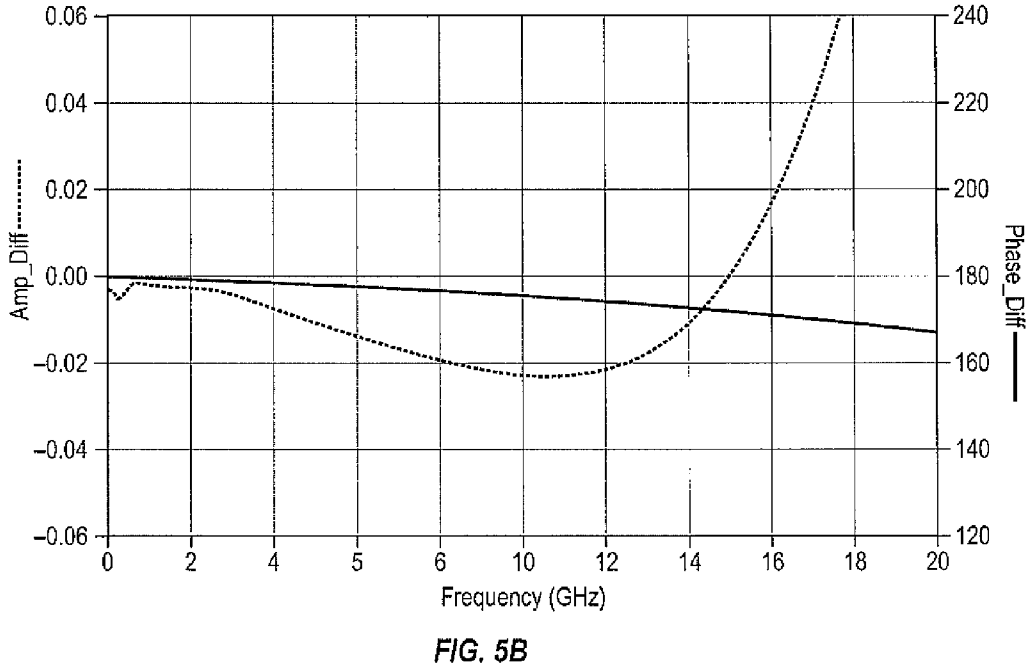
FIG. 5B is a graph illustrating phase difference and amplitude difference when the phase shifter includes FET switches according to some embodiments of the present invention.

FIG. 5A is a graph illustrating insertion loss and input/output matching when the phase shifter includes FET switches according to some embodiments of the present invention, and FIG. 5B is a graph illustrating phase difference and amplitude difference when the phase shifter includes FET switches according to some embodiments of the present invention.

Referring to FIG. 5A, the solid line represents insertion loss and the dotted line represents input/output matching. Referring to FIG. 5B, the solid line represents phase difference and the dotted line represents amplitude difference. As shown in FIGS. 5A and 5B, the phase shifter using 80 um/0.15 um GaN FET switches was simulated over a frequency range of 0-20 GHz. In the simulation, a phase shift of about 170-180 degrees was achieved over 20:1 bandwidth with only about 2.5 dB of loss.

Figure 6A:
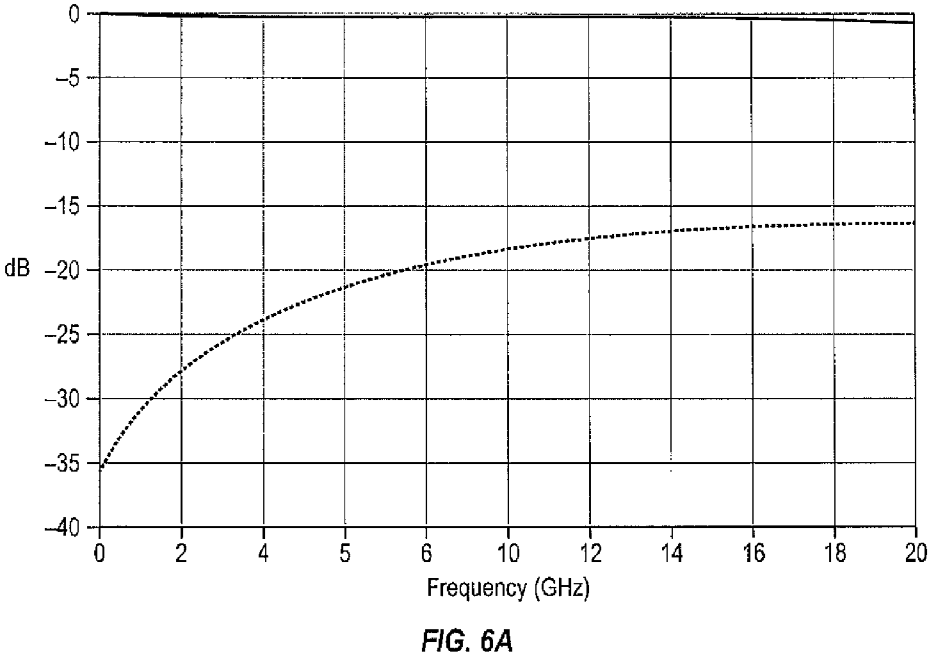
FIG. 6A is a graph illustrating insertion loss and input/output matching when the phase shifter includes ohmic switches according to some embodiments of the present invention.
Figure 6B:
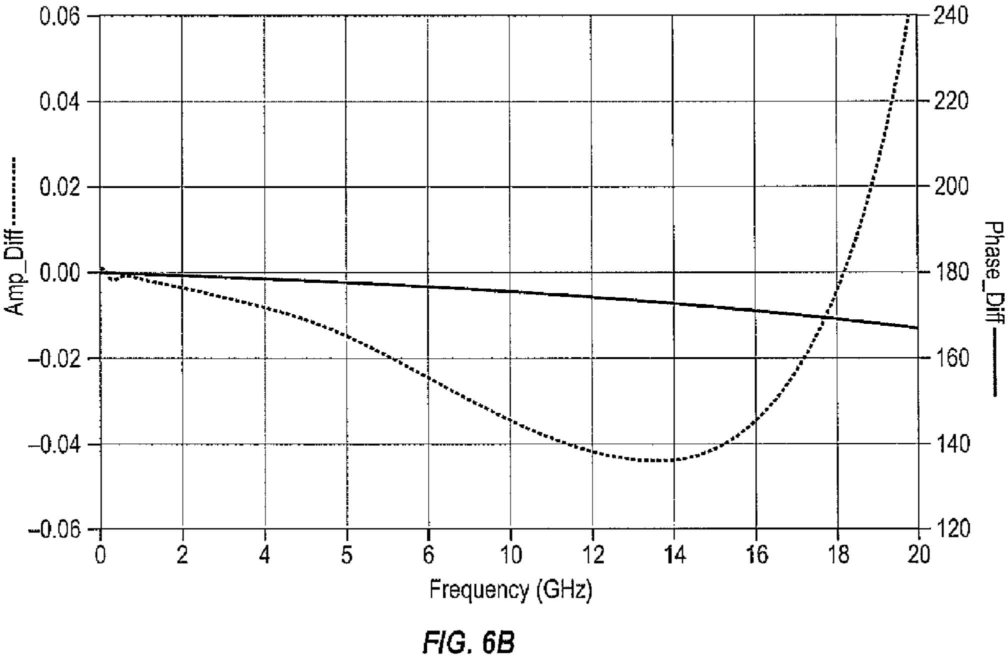
FIG. 6B is a graph illustrating phase difference and amplitude difference when the phase shifter includes ohmic switches according to some embodiments of the present invention.

FIG. 6A is a graph illustrating insertion loss and input/output matching when the phase shifter includes ohmic switches according to some embodiments of the present invention, and FIG. 6B is a graph illustrating phase difference and amplitude difference when the phase shifter includes ohmic switches according to some embodiments of the present invention.

Referring to FIG. 6A, the solid line represents insertion loss and the dotted line represents input/output matching. Referring to FIG. 6B, the solid line represents phase difference and the dotted line represents amplitude difference. As shown in FIGS. 6A and 6B, the phase shifter using ohmic switches was simulated over a frequency range of 0-20 GHz. In the simulation, a phase shift of about 170-180 degrees was achieved over 20:1 bandwidth with only about 1 dB of loss.

Accordingly, in some embodiments of the present invention, the balun may include the double-y junction portion including the balanced stubs and the unbalanced stubs. At least one of the stubs may include a switch. In some embodiments, each of the balanced and unbalanced stubs may include a switch. In some embodiments, each of the balanced stubs may include a switch, and each of the unbalanced stubs may not include a switch. In some embodiments, each of the unbalanced stubs may include a switch, and each of the balanced stubs may not include a switch. The switch may change an open or closed state of the stub, thereby changing the symmetry of the double-y junction portion, and thus, changing the path of the signal through the balanced and unbalanced stubs. Accordingly, the phase of the signal may be shifted (e.g., inverted or about 180 degree phase shifted).

According to some embodiments, the phase shifter may include two baluns back-to-back so that the balanced ports of each of the baluns face each other. In some embodiments, the double-y junction portion of at least one of the two baluns may include a switch. In some embodiments, each of the balanced and unbalanced stubs of at least one of the two baluns may include a switch. In some embodiments, each of the balanced stubs of the two baluns may include a switch, and each of the unbalanced stubs of the two baluns may not include a switch. In some embodiments, each of the unbalanced stubs of the two baluns may include a switch, and each of the balanced stubs of the two baluns may not include a switch. The switch may change an open or closed state of the stub, thereby changing the symmetry of the double-y junction portion, and thus, changing the path of the signal through the balanced and unbalanced stubs. Accordingly, the phase of the signal may be shifted (e.g., inverted or about 180 degree phase shifted).

According to some embodiments, the phase shifter may include two baluns back-to-back so that the balanced ports of each of the baluns face each other. Each of the stubs in one of the baluns may include a switch, while each of the stubs in the other balun may be hardwired to be either an open or closed stub. The switches may control the open or closed state of the stubs to change the symmetry of the double-y junction portion of the corresponding balun. Thus, the path of the signal through the stubs may be changed, and the phase of the signal may be shifted (e.g., inverted or about 180 degree phase shifted).

Although the present invention has been described with reference to the example embodiments, those skilled in the art will recognize that various changes and modifications to the described embodiments may be performed, all without departing from the spirit and scope of the present invention.

It will be understood that, although the terms “first,” “second,” “third,” etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Furthermore, those skilled in the various arts will recognize that the present invention described herein will suggest solutions to other tasks and adaptations for other applications. It is the applicant's intention to cover by the claims herein, all such uses of the present invention, and those changes and modifications which could be made to the example embodiments of the present invention herein chosen for the purpose of disclosure, all without departing from the spirit and scope of the present invention. Thus, the example embodiments of the present invention should be considered in all respects as illustrative and not restrictive, with the spirit and scope of the present invention being indicated by the appended claims, and their equivalents.

What is claimed is:

1. A balun comprising:

a balanced port;

an unbalanced port; and a double-y junction portion between the balanced port and the unbalanced port, the double-y junction portion comprising:

a balanced y junction portion having first and second balanced stubs; and an unbalanced y junction portion having first and second unbalanced stubs, wherein at least one of the first balanced stub, the second balanced stub, the first unbalanced stub, and the second unbalanced stub comprises a switch.

2. The balun of claim 1, wherein the first balanced stub comprises a first switch, the second balanced stub comprises a second switch, the first unbalanced stub comprises a third switch, and the second unbalanced stub comprises a fourth switch.

3. The balun of claim 2, wherein the first and fourth switches are configured to be closed and the second and third switches are configured to be open during a reference mode, and the first and fourth switches are configured to be open and the second and third switches are configured to be closed during a phase shift mode.

4. The balun of claim 2, wherein each of the first, second, third, and fourth switches comprises a field effect transistor (FET).

5. The balun of claim 2, wherein each of the first, second, third, and fourth switches comprises a microelectromechanical system (MEMS) switch.

6. The balun of claim 1, wherein the unbalanced y junction portion including the unbalanced port comprises a coplanar waveguide (CPW), and the balanced y junction portion including the balanced port comprises a slot line.

7. The balun of claim 1, wherein the unbalanced y junction portion including the unbalanced port comprises a microstrip, and the balanced y junction portion including the balanced port comprises a slot line.

8. A phase shifter comprising:

a balanced port;

a first unbalanced port; and a first double-y junction portion between the balanced port and the first unbalanced port, the first double-y junction portion comprising:

a first y portion having first and second stubs; and a second y portion having third and fourth stubs, wherein at least one of the first, second, third, and fourth stubs comprise a switch.

9. The phase shifter of claim 8, wherein the switch comprises a field effect transistor (FET).

10. The phase shifter of claim 8, wherein the switch comprises a microelectromechanical system (MEMS) switch.

11. The phase shifter of claim 8 further comprising:

a second unbalanced port coupled to the balanced port; and a second double-y transition portion between the balanced port and the second unbalanced port, the second double-y transition portion comprising:

a third y portion having fifth and sixth stubs; and a fourth y portion having seventh and eighth stubs.

12. The phase shifter of claim 11, wherein the first stub comprises a first switch, the second stub comprises a second switch, the third stub comprises a third switch, and the fourth stub comprises a fourth switch.

13. The phase shifter of claim 12, wherein the fifth stub is configured to be a closed stub, the sixth stub is configured to be an open stub, the seventh stub is configured to be an open stub, and the eighth stub is configured to be a closed stub.

14. The phase shifter of claim 13, wherein the first and fourth switches are configured to be closed and the second and third switches are configured to be open during a reference mode, and the first and fourth switches are configured to be open and the second and third switches are configured to be closed during a phase shift mode.

15. The phase shifter of claim 11, wherein each of the first, second, seventh, and eighth stubs include a switch, and each of the third, fourth, fifth, and sixth stubs do not include a switch.

16. The phase shifter of claim 11, wherein each of the first, second, seventh, and eighth stubs do not include a switch, and each of the third, fourth, fifth, and sixth stubs include a switch.

17. The phase shifter of claim 11, wherein at least one of the first y portion and the fourth y portion comprise a coplanar waveguide (CPW).

18. The phase shifter of claim 17, wherein the second y portion and the third y portion comprise a slot line.

19. The phase shifter of claim 11, wherein at least one of the first y portion and the fourth y portion comprise a microstrip.

20. The phase shifter of claim 19, wherein the second y portion and the third y portion comprise a slot line.

* * * * *